(12) United States Patent
Hirata et al.

(10) Patent No.: US 12,062,548 B2
(45) Date of Patent: Aug. 13, 2024

(54) ETCHING METHOD FOR OXIDE SEMICONDUCTOR FILM

(71) Applicant: Sony SemiConductor Solutions Corporation, Kanagawa (JP)

(72) Inventors: Akiko Hirata, Kanagawa (JP); Tetsuya Tatsumi, Kanagawa (JP); Masanaga Fukasawa, Kanagawa (JP); Satoshi Hamaguchi, Kanagawa (JP); Kazuhiro Karahashi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 385 days.

(21) Appl. No.: 17/421,926

(22) PCT Filed: Dec. 19, 2019

(86) PCT No.: PCT/JP2019/049908
§ 371 (c)(1),
(2) Date: Jul. 9, 2021

(87) PCT Pub. No.: WO2020/145080
PCT Pub. Date: Jul. 16, 2020

(65) Prior Publication Data
US 2022/0122852 A1    Apr. 21, 2022

(30) Foreign Application Priority Data
Jan. 11, 2019  (JP) .................. 2019-003234

(51) Int. Cl.
*H01L 21/3213* (2006.01)
*H01L 27/146* (2006.01)
(Continued)

(52) U.S. Cl.
CPC .. *H01L 21/32136* (2013.01); *H01L 27/14692* (2013.01); *H01L 29/66742* (2013.01); *H01L 29/7869* (2013.01)

(58) Field of Classification Search
CPC ......... H01L 21/32136; H01L 27/14692; H01L 29/66742; H01L 29/7869; H01L 29/24; H01L 21/465
See application file for complete search history.

(56) References Cited

U.S. PATENT DOCUMENTS 5,213,659 A    5/1993  Blalock et al.
2001/0018238 A1*  8/2001  Kim .................. H01L 27/14659
                                                438/73

(Continued)

FOREIGN PATENT DOCUMENTS

| CN | 102956681 A | 3/2013 |
|---|---|---|
| JP | S61131531 A | 6/1986 |

(Continued)

OTHER PUBLICATIONS

Takei, JP-H0897190-A, Machine Translation, whole document. (Year: 2023).*

(Continued)

*Primary Examiner* — Duy N Deo
*Assistant Examiner* — Christopher Remavege
(74) *Attorney, Agent, or Firm* — K&L Gates LLP

(57) ABSTRACT

In an etching method for an oxide semiconductor film according to an embodiment of the present disclosure, a modified layer is formed in the oxide semiconductor film by using a first rare gas and the modified layer is sputtered by using a second rare gas different from the first rare gas.

6 Claims, 13 Drawing Sheets

(51) Int. Cl.
*H01L 29/66* (2006.01)
*H01L 29/786* (2006.01)

(56) References Cited

U.S. PATENT DOCUMENTS

| | | | |
|---|---|---|---|
| 2004/0066484 | A1 | 4/2004 | Tokailin et al. |
| 2010/0117075 | A1* | 5/2010 | Akimoto ............ H01L 29/7869 257/43 |
| 2011/0250724 | A1 | 10/2011 | Suzawa |
| 2012/0244658 | A1 | 9/2012 | Koezuka |
| 2013/0043467 | A1* | 2/2013 | Takechi ................ H01L 21/46 257/43 |
| 2016/0218000 | A1* | 7/2016 | Choi ................ H01L 29/66969 |
| 2017/0012134 | A1 | 1/2017 | Sasaki |
| 2017/0107641 | A1* | 4/2017 | Busardo ............ C23C 14/0015 |
| 2017/0221682 | A1 | 8/2017 | Nishimura et al. |
| 2017/0352560 | A1 | 12/2017 | Kato et al. |
| 2019/0305116 | A1* | 10/2019 | Wu .................. H01L 21/02554 |

FOREIGN PATENT DOCUMENTS

| | | | | |
|---|---|---|---|---|
| JP | H0897190 | A | * | 9/1994 |
| JP | H1083984 | A | | 3/1998 |
| JP | H10335335 | A | | 12/1998 |
| JP | H1116888 | A | | 1/1999 |
| JP | 2000133064 | A | | 5/2000 |
| JP | 2000183040 | A | | 6/2000 |
| JP | 2000183052 | A | | 6/2000 |
| JP | 2000183052 | A | * | 6/2000 |
| JP | 2002170431 | A | | 6/2002 |
| JP | 2003158119 | A | * | 5/2003 |
| JP | 2003298375 | A | | 10/2003 |
| JP | 2010135770 | A | | 6/2010 |
| JP | 2016082020 | A | | 5/2016 |
| JP | 2017216391 | A | | 12/2017 |
| KR | 20070040267 | A | * | 10/2005 |
| TW | 201034201 | A | | 9/2010 |
| TW | 201123313 | A | | 7/2011 |
| TW | 201742158 | A | | 12/2017 |

OTHER PUBLICATIONS

Odakawa K, JP-2003158119-A, Machine Translation, Abstract. (Year: 2023).*
Seo Gi Weon, KR-20070040267-A, Machine Translation, Abstract. (Year: 2023).*
Hasegawa, JP-2000183052-A, Machine Translation. (Year: 2024).*
International Search Report mailed Feb. 25, 2020 in connection with PCT/JP2019/049908.

* cited by examiner

[ FIG. 1A ]
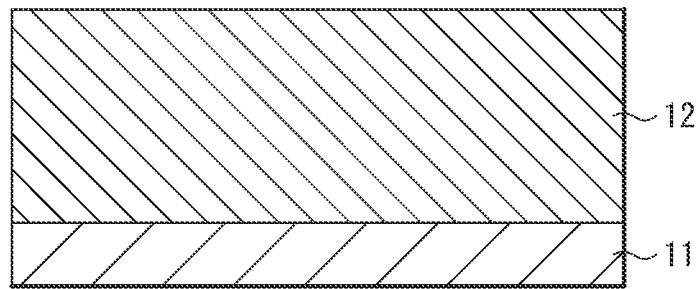
[ FIG. 1B ]
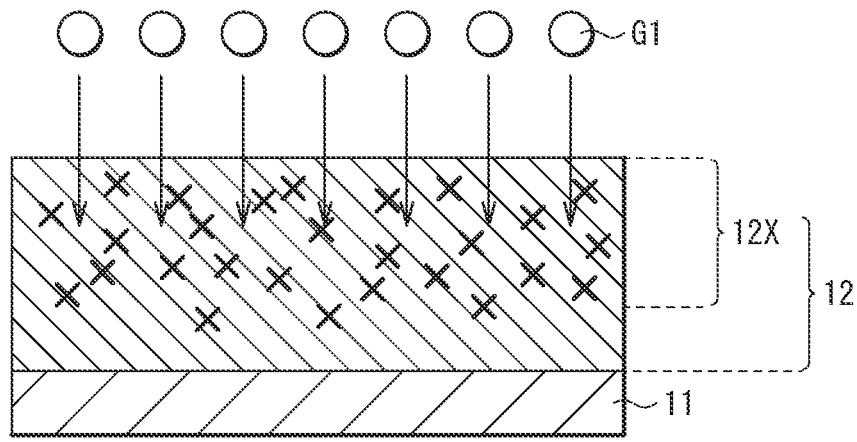
[ FIG. 1C ]
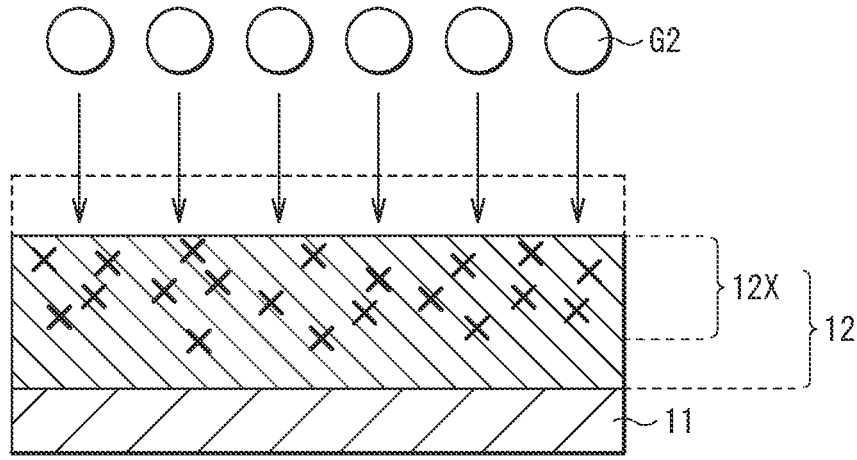

[FIG. 2]
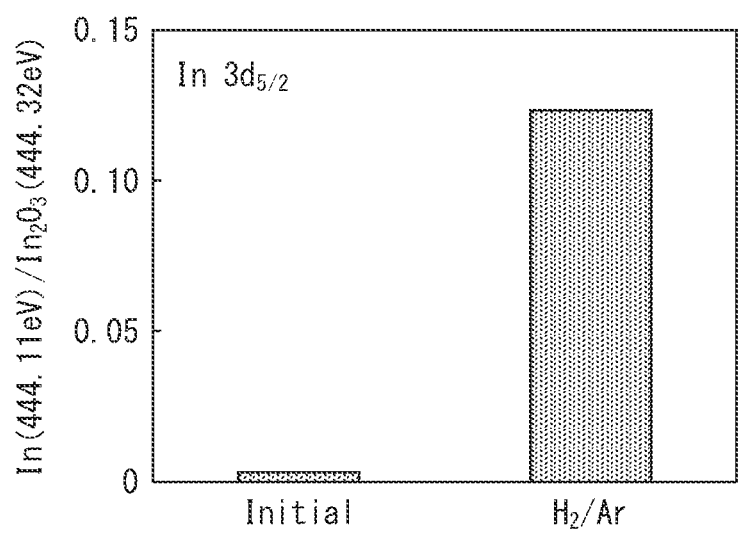

[ FIG. 3A ]
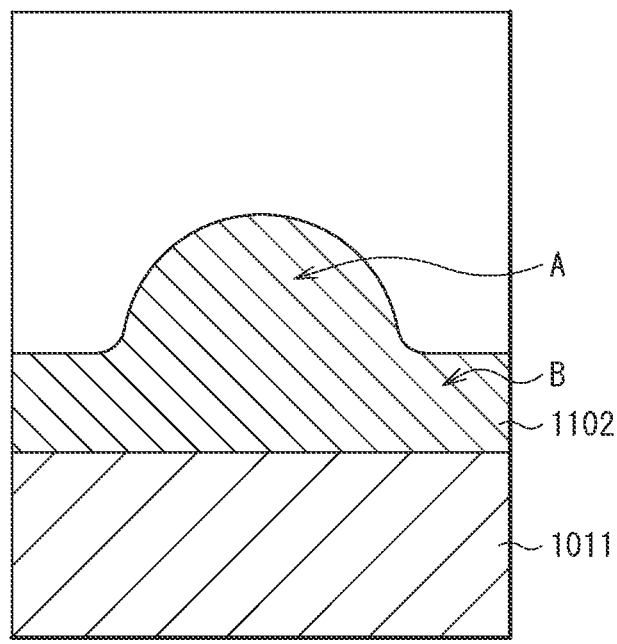
[ FIG. 3B ]
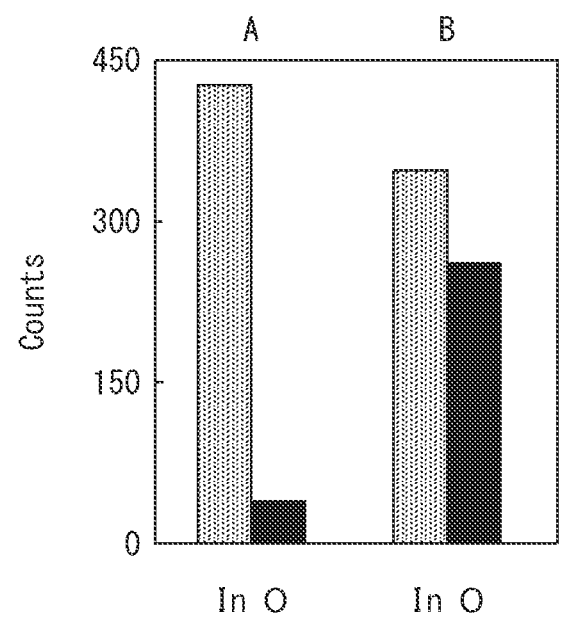

[ FIG. 4A ]
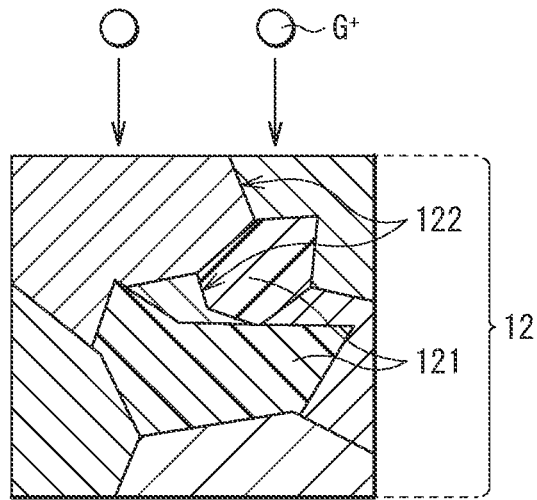
[ FIG. 4B ]
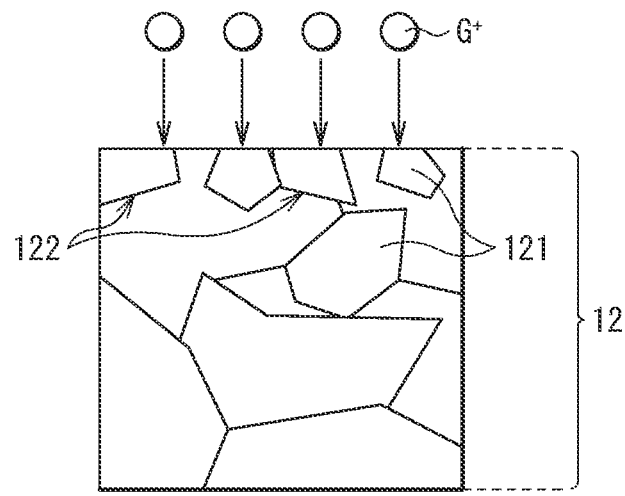
[ FIG. 4C ]
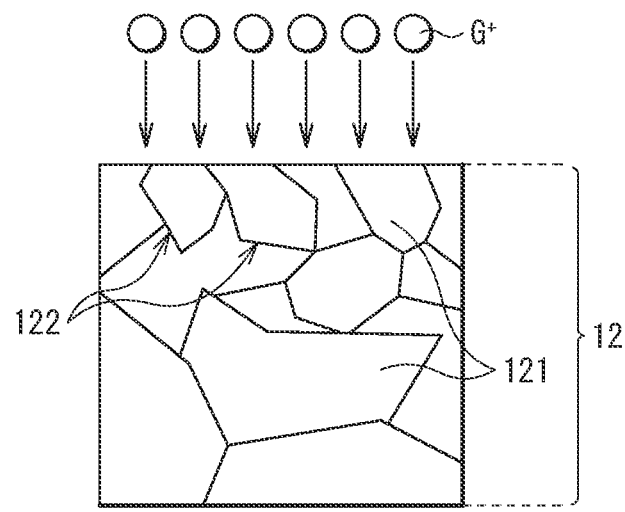

[ FIG. 5A ]
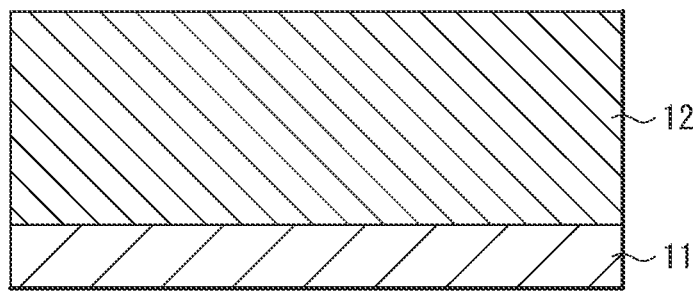
[ FIG. 5B ]
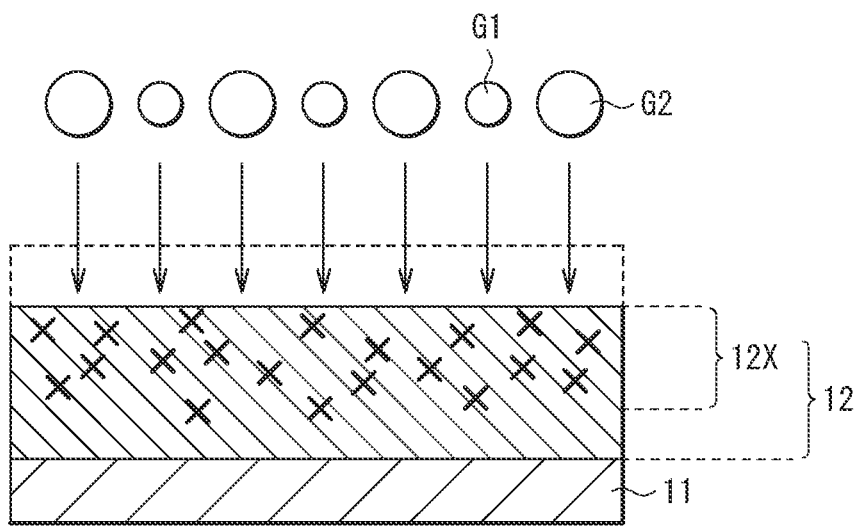

[ FIG. 6A ]
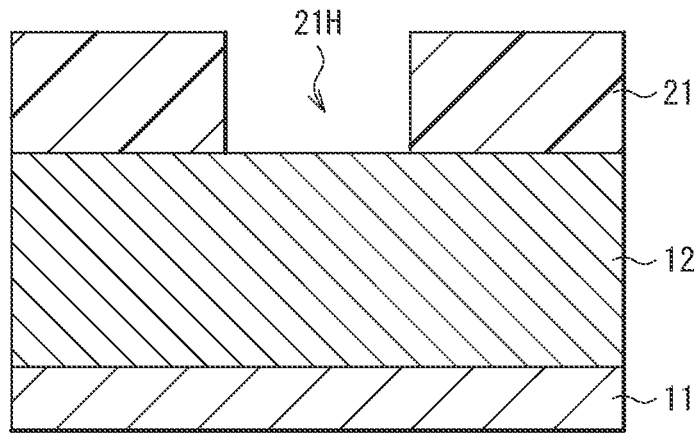
[ FIG. 6B ]
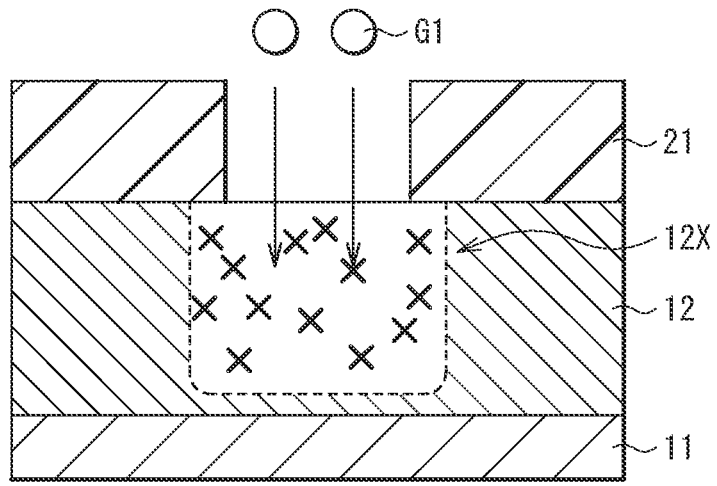
[ FIG. 6C ]
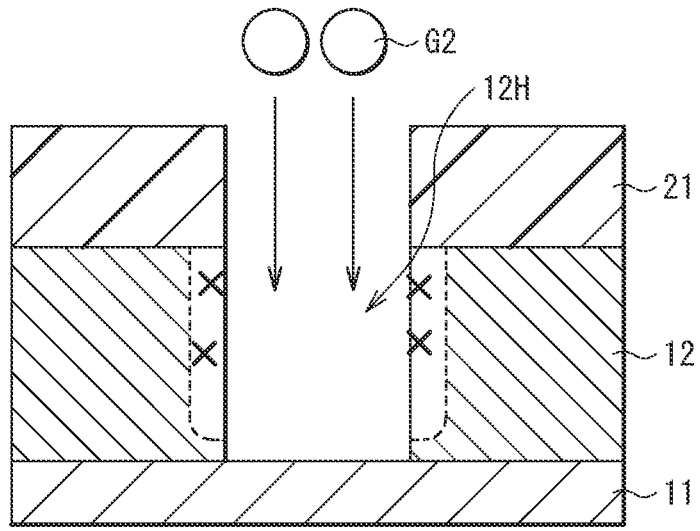

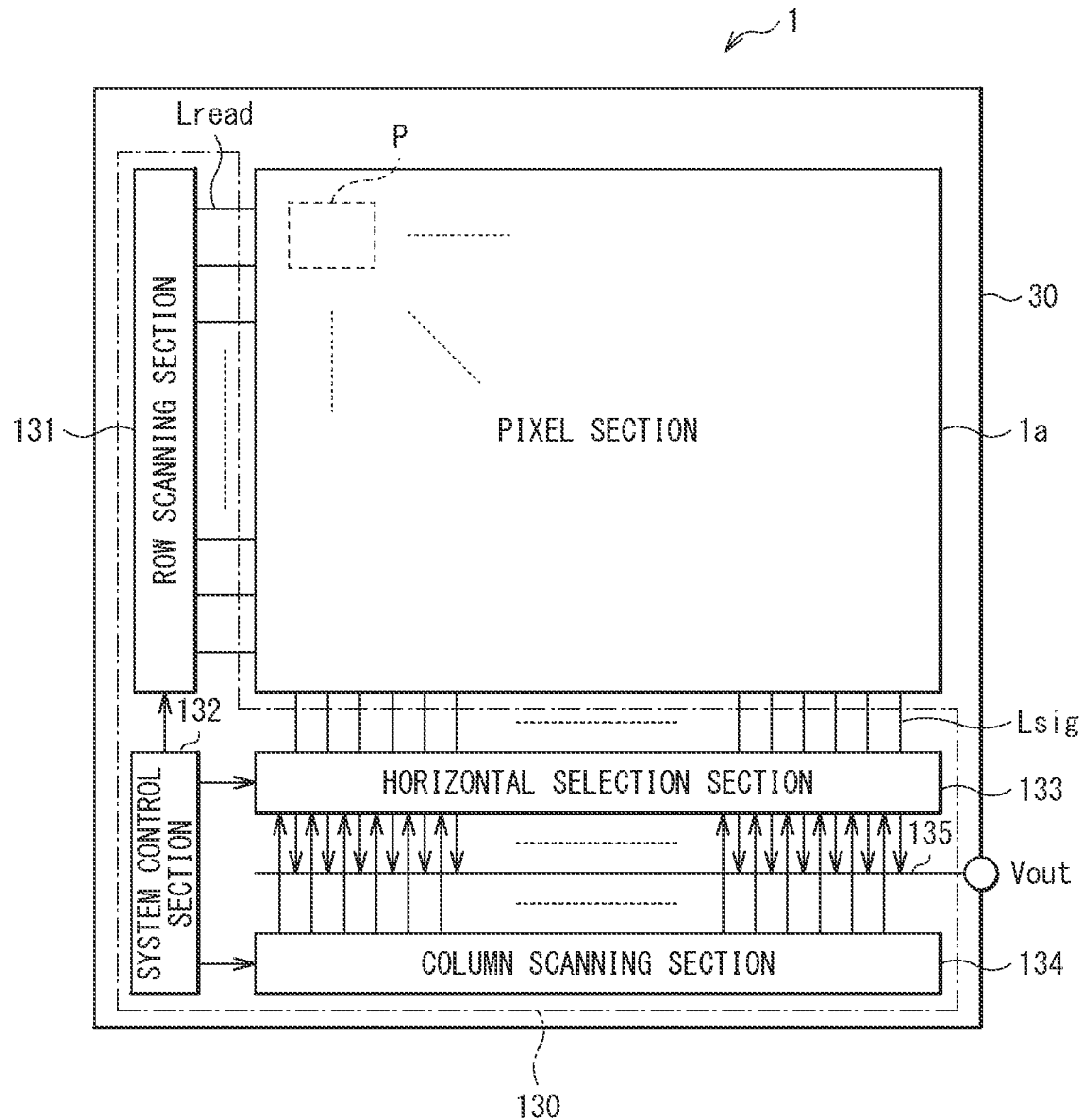
[FIG. 7]

[FIG. 8]
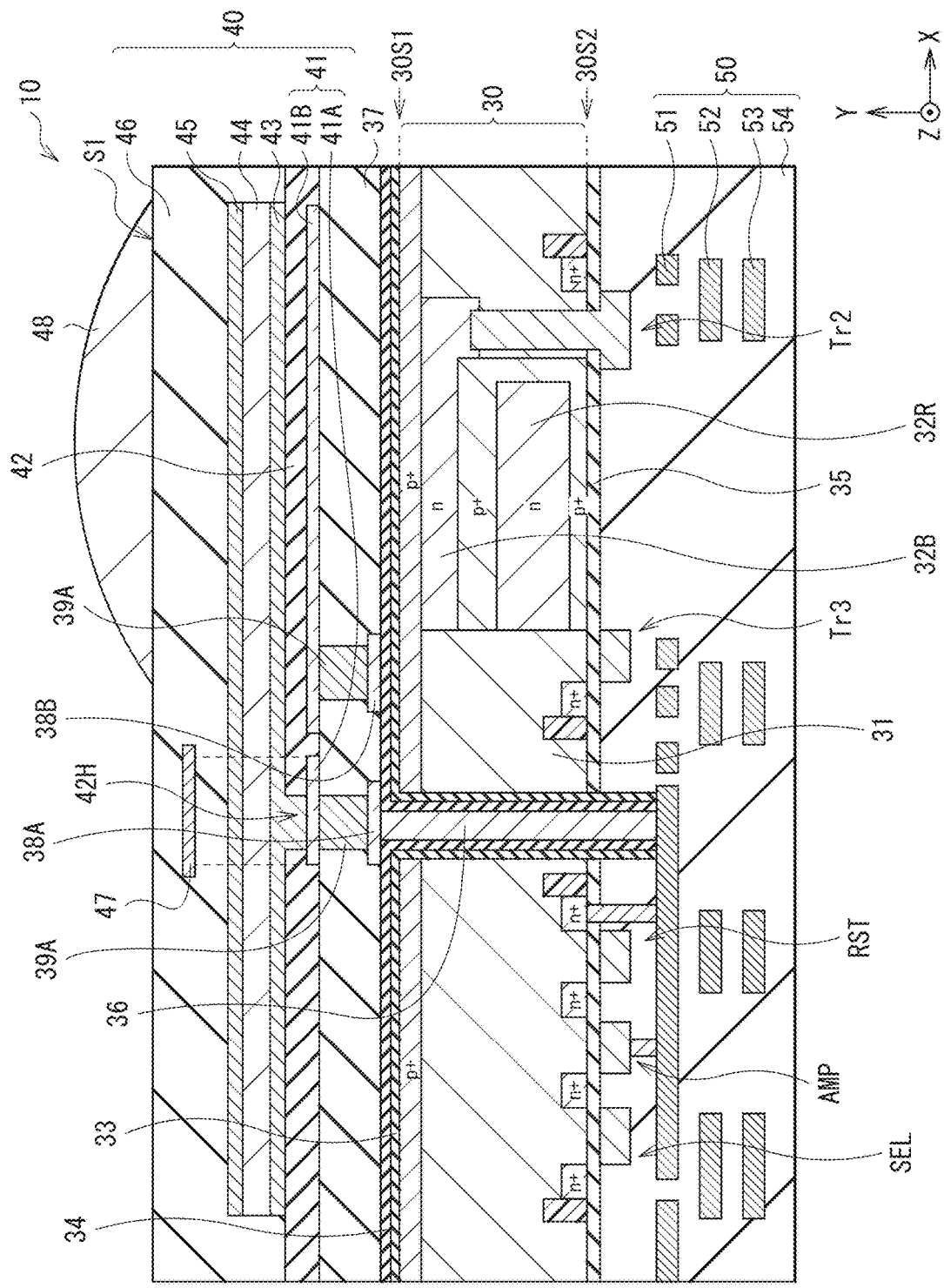

[ FIG. 9 ]
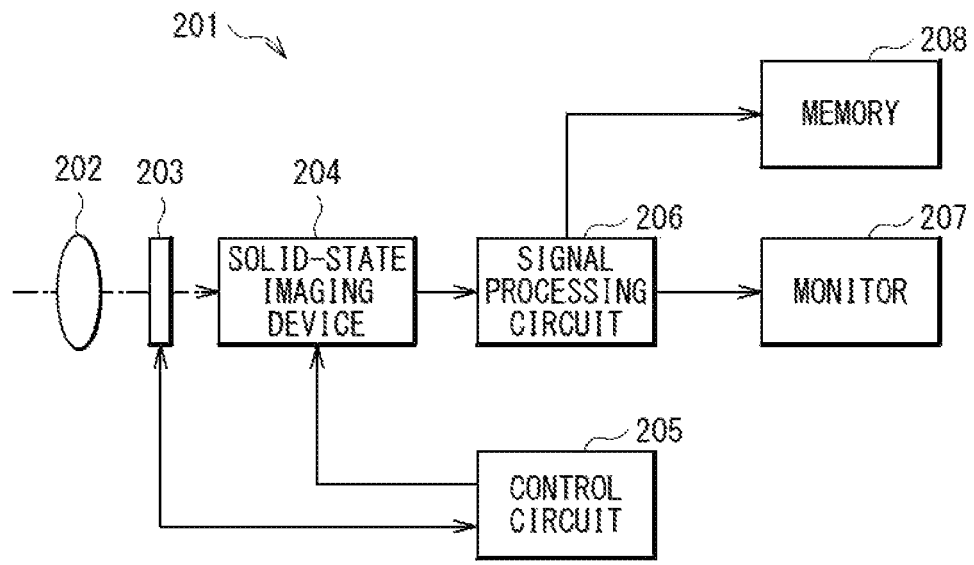
[ FIG. 10 ]
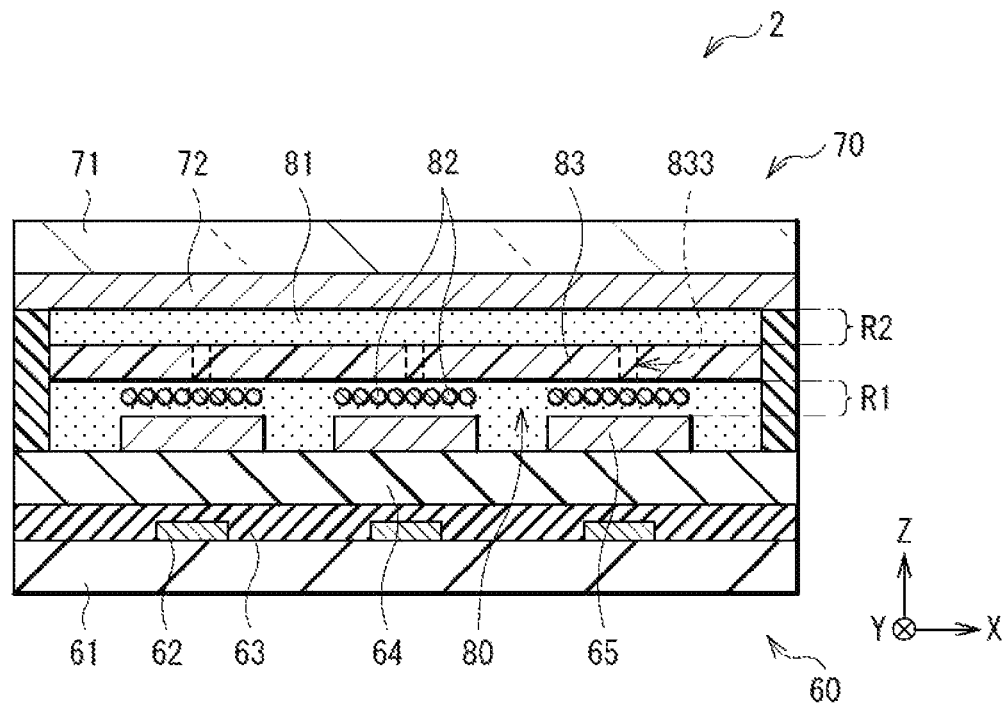

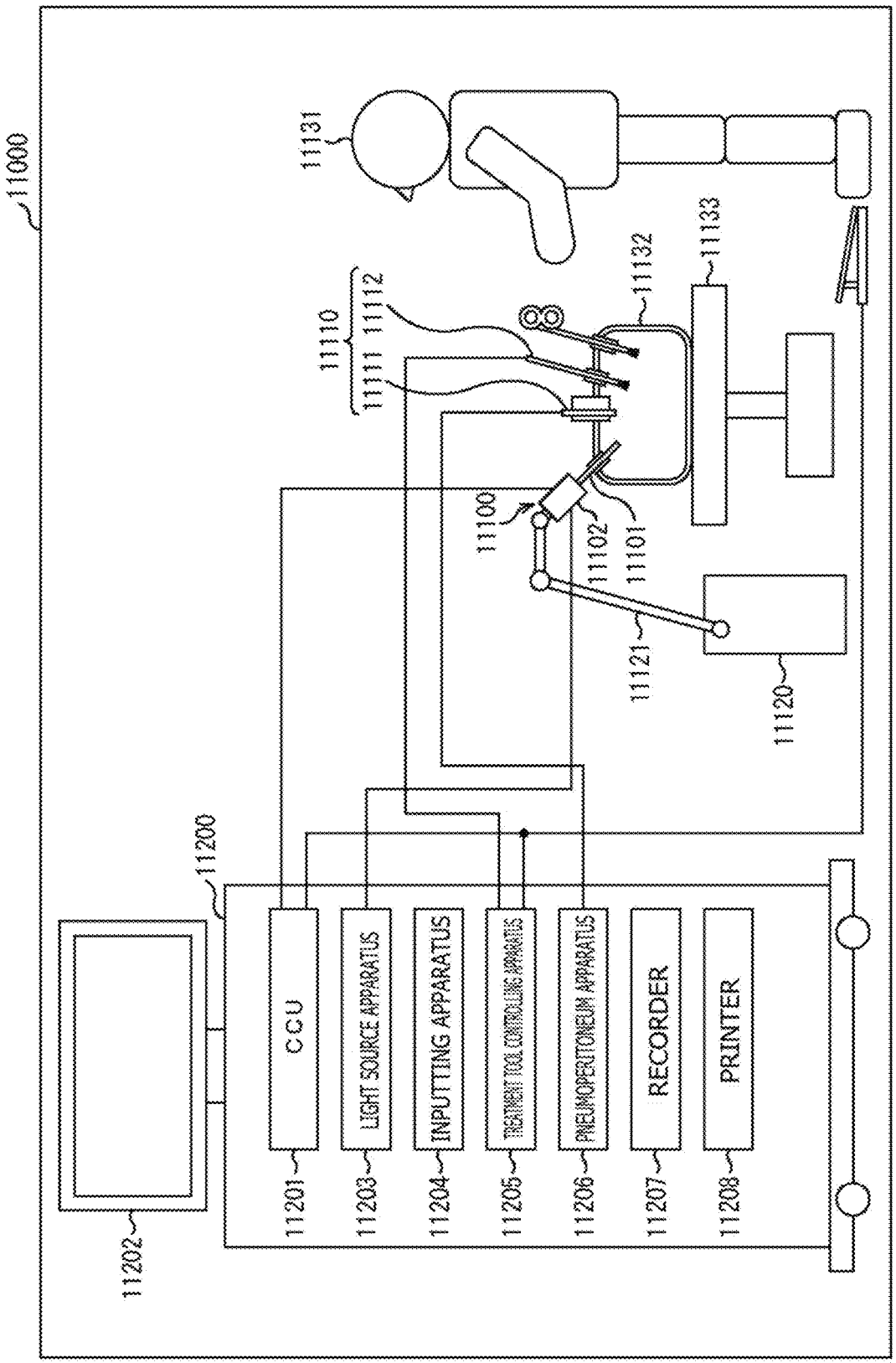

[ FIG. 12 ]
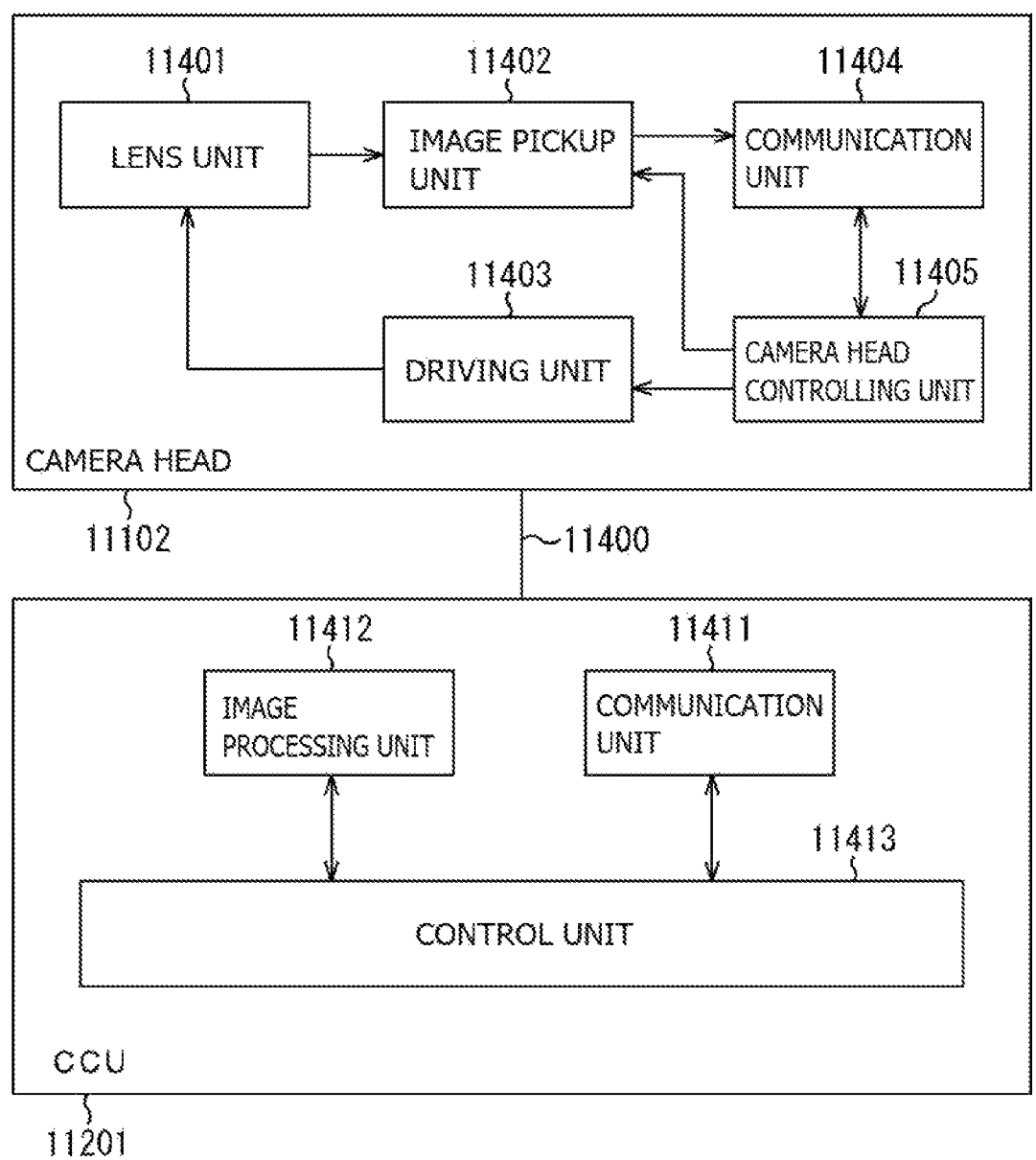

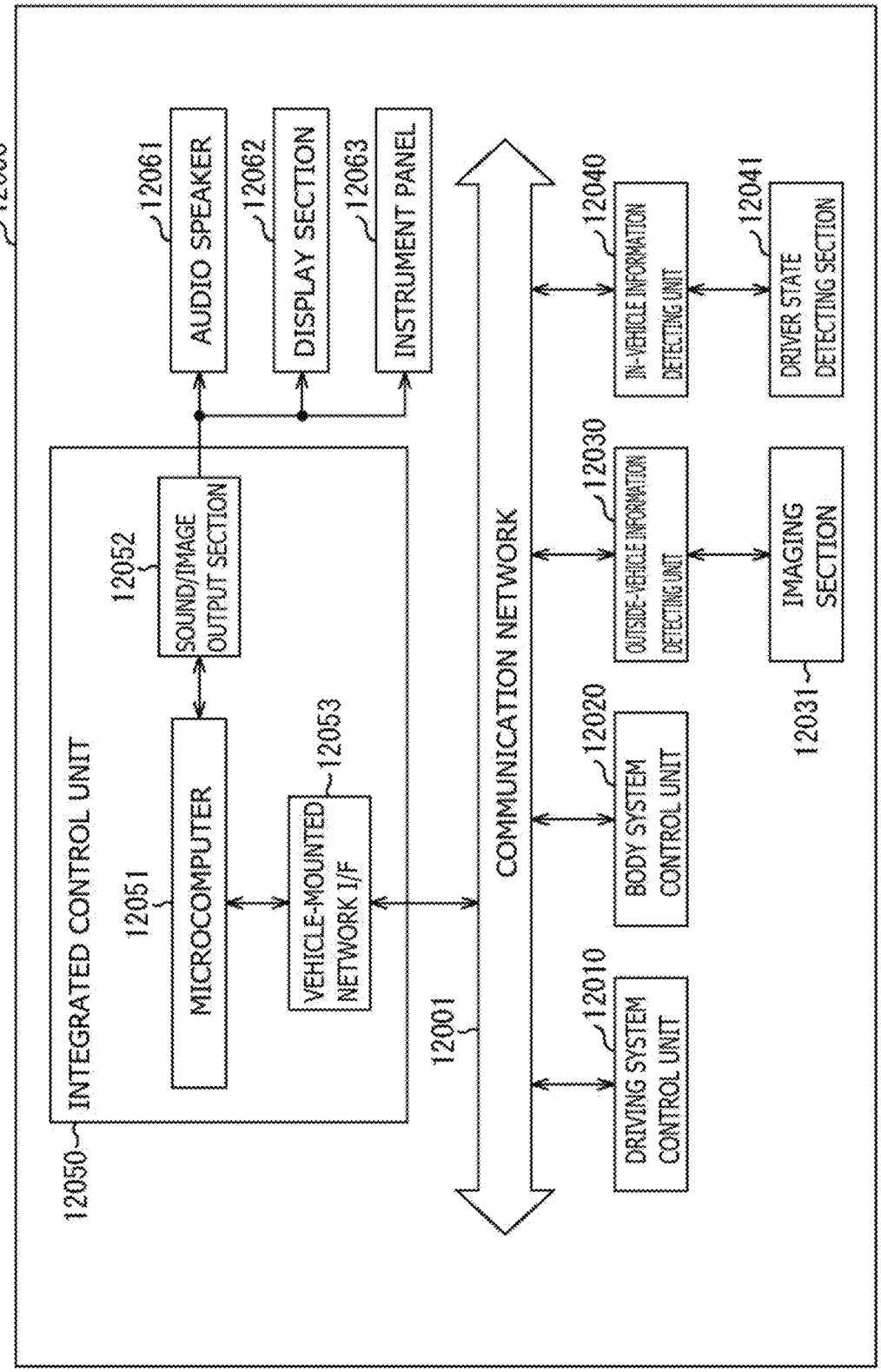
[FIG. 13]

[ FIG. 14 ]
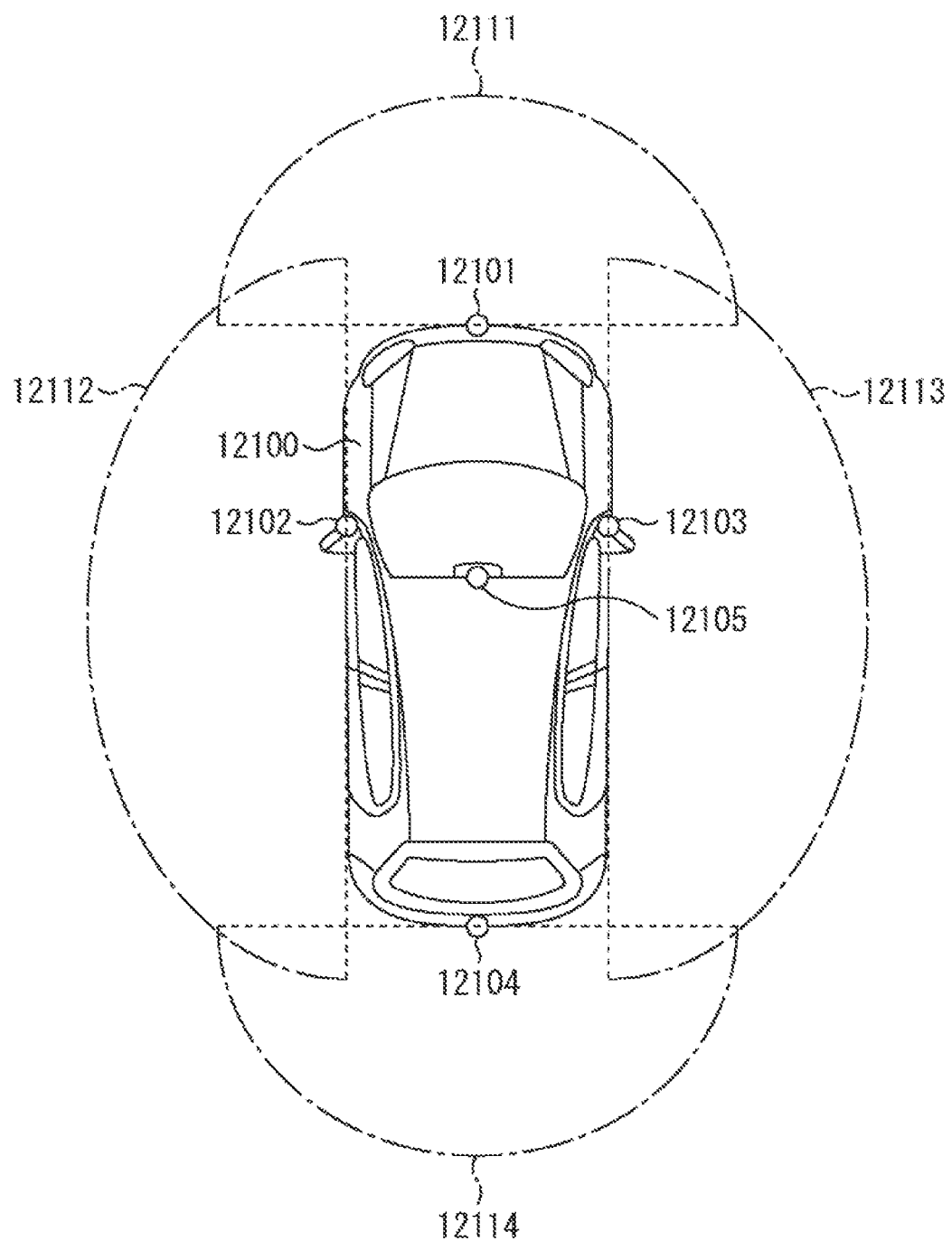

ETCHING METHOD FOR OXIDE SEMICONDUCTOR FILM

TECHNICAL FIELD

The present disclosure relates to an etching method for an oxide semiconductor film included, for example, in an electrode of an electronic device.

BACKGROUND ART

For example, as an etching method for a silicon nitride (SiN) film, NPTL 1 reports an etching method in which a modified layer is formed on a surface by hydrogen plasma irradiation and the modified layer is then removed by fluorine radical irradiation.

CITATION LIST

Non-Patent Literature

NPTL 1: Sonam D. Sherpa and Alok Ranjan. J. Vac. Sci. Technol. A35 01A102 (2017)

SUMMARY OF THE INVENTION

Incidentally, in a case where hydrogen plasma is used to etch an oxide semiconductor film as described above, there is an issue that the composition of the oxide semiconductor film changes over time and the characteristics of a device including the oxide semiconductor film are deteriorated.

It is desirable to provide an etching method for an oxide semiconductor that makes it possible to suppress a temporal change in the composition ratio of an oxide semiconductor film.

In an etching method for an oxide semiconductor film according to an embodiment of the present disclosure, a modified layer is formed in the oxide semiconductor film by using a first rare gas and the modified layer is sputtered by using a second rare gas different from the first rare gas.

In the etching method for the oxide semiconductor film according to the embodiment of the present disclosure, the modified layer is formed in the oxide semiconductor film by using the first rare gas and the modified layer is then sputtered by using the second rare gas, thereby preventing oxygen from being desorbed from the oxide semiconductor film after the sputtering.

BRIEF DESCRIPTION OF DRAWING

FIG. 1A is a cross-sectional schematic diagram for describing an etching method for an oxide semiconductor film according to a first embodiment of the present disclosure.

FIG. 1B is a cross-sectional schematic diagram illustrating a step subsequent to FIG. 1A.

FIG. 1C is a cross-sectional schematic diagram illustrating a step subsequent to FIG. 1B.

FIG. 2 is a characteristic diagram illustrating a film composition change before and after typical etching.

FIG. 3A is a schematic diagram of a TEM image of an ITO film after $H_2$ plasma irradiation.

FIG. 3B is a diagram illustrating composition ratios between In and O in A and B illustrated in FIG. 3A.

FIG. 4A is a schematic diagram illustrating a change in a film structure of an oxide semiconductor film caused by rare gas irradiation.

FIG. 4B is a schematic diagram illustrating a change in the film structure of the oxide semiconductor film caused by the rare gas irradiation subsequent to FIG. 4A.

FIG. 4C is a schematic diagram illustrating a change in the film structure of the oxide semiconductor film caused by the rare gas irradiation subsequent to FIG. 4B.

FIG. 5A is a cross-sectional schematic diagram for describing an etching method for an oxide semiconductor film according to a second embodiment of the present disclosure.

FIG. 5B is a cross-sectional schematic diagram illustrating a step subsequent to FIG. 5A.

FIG. 6A is a cross-sectional schematic diagram illustrating an etching step for an oxide semiconductor film according to a third embodiment.

FIG. 6B is a cross-sectional schematic diagram illustrating a step subsequent to FIG. 6A.

FIG. 6C is a cross-sectional schematic diagram illustrating a step subsequent to FIG. 6B.

FIG. 7 is a block diagram illustrating a configuration of an imaging element including an oxide semiconductor film processed by using the etching method illustrated in FIGS. 1A to 1C and the like.

FIG. 8 is a cross-sectional schematic diagram of a photoelectric converter included in the imaging element illustrated in FIG. 7.

FIG. 9 is a diagram describing a configuration of an electronic apparatus including the imaging element illustrated in FIG. 7.

FIG. 10 is a cross-sectional schematic diagram of a reflective display apparatus including the oxide semiconductor film processed by using the etching method illustrated in FIGS. 1A to 1C and the like.

FIG. 11 is a view depicting an example of a schematic configuration of an endoscopic surgery system.

FIG. 12 is a block diagram depicting an example of a functional configuration of a camera head and a camera control unit (CCU).

FIG. 13 is a block diagram depicting an example of schematic configuration of a vehicle control system.

FIG. 14 is a diagram of assistance in explaining an example of installation positions of an outside-vehicle information detecting section and an imaging section.

MODES FOR CARRYING OUT THE INVENTION

The following describes embodiments of the present disclosure in detail with reference to the drawings. It is to be noted that description is given in the following order.
1. First Embodiment (Example of an etching method in which two types of rare gases are radiated in order)
   1-1. Etching Method for Oxide Semiconductor
   1-2. Workings and Effects
2. Second Embodiment (Example of an etching method in which a mixture of two types of rare gases is radiated)
3. Third Embodiment (Specific example of an etching step)
4. Application Examples
5. Practical Application Examples

1. First Embodiment

Each of FIGS. 1A to 1C is a cross-sectional schematic diagram illustrating an etching step for an oxide semiconductor film (oxide semiconductor film 12) according to a first embodiment of the present disclosure. The oxide semiconductor film 12 is used, for example, as an electrode included in any of various displays such as a flat panel display and a touch panel and devices such as a solar cell and a light emitting diode (Light Emitting Diode; LED). Additionally, the oxide semiconductor film 12 is also used for an electromagnetic shield, an anti-reflection film, and the like. The etching method according to the present disclosure is favorably used, for example, to pattern the oxide semiconductor film 12 included in an electrode.

(1-1. Etching Method for Oxide Semiconductor)

In the etching method for the oxide semiconductor film 12 according to the present embodiment, a modification is made by using a rare gas G1 (first rare gas) to form a modified layer 12X in the oxide semiconductor film 12 and sputtering is then performed by using a rare gas G2 (second rare gas) different from the rare gas G1 to process the oxide semiconductor film 12 into a predetermined shape. The following describes the etching method for the oxide semiconductor film 12 with reference to FIGS. 1A to 1C.

First, as illustrated in FIG. 1A, the oxide semiconductor film 12 is formed on a support base 11 by using, for example, a dry method or a wet method. The dry method includes a physical vapor deposition method (PVD method) and a chemical vapor deposition method (CVD method). A film formation method using the principle of the PVD method includes a vacuum evaporation method using resistance heat or high-frequency heating, an EB (electron beam) evaporation method, various sputtering methods (a magnetron sputtering method or a high-frequency sputtering method), an ion plating method, a laser ablation method, a molecular beam epitaxy method, and a laser transfer method. A film formation method using the principle of the CVD method includes a plasma CVD method, a thermal CVD method, a metal-organic (MO) CVD method, and a photo-CVD method. The wet method includes an electroplating method, an electroless plating method, a spin coating method, an inkjet method, a spray coating method, a stamp method, a microcontact printing method, a flexographic printing method, an offset printing method, a gravure printing method, a dip method, and the like. As described above, the oxide semiconductor film 12 is used, for example, as an electrode included in any of various devices. Examples of a specific material include indium oxide, indium tin oxide (Indium Tin Oxide; ITO including Sn-doped $In_2O_3$, crystalline ITO, and amorphous ITO), indium zinc oxide (Indium Zinc Oxide; IZO) obtained by adding indium as a dopant to zinc oxide, indium gallium oxide (IGO) obtained by adding indium as a dopant to gallium oxide, indium gallium zinc oxide (IGZO or $In\text{-}GaZnO_4$) obtained by adding indium and gallium as dopants to zinc oxide, indium tin zinc oxide (ITZO) obtained by adding indium and tin as dopants to zinc oxide, IFO (F-doped $In_2O_3$), tin oxide ($SnO_2$), ATO (Sb-doped $SnO_2$), FTO (F-doped $SnO_2$), zinc oxide (including ZnO to which another element is doped), aluminum zinc oxide (AZO) obtained by adding aluminum as a dopant to zinc oxide, gallium zinc oxide (GZO) obtained by adding gallium as a dopant to zinc oxide, titanium oxide ($TiO_2$), niobium titanium oxide (TNO) obtained by adding niobium as a dopant to titanium oxide, antimony oxide, spinel-type oxide, and oxide having a $YbFe_2O_4$ structure. Additionally, the specific material includes a transparent electrode material having a base layer of gallium oxide, titanium oxide, niobium oxide, nickel oxide, or the like.

Subsequently, as illustrated in FIG. 1B, the modified layer 12X is formed in the oxide semiconductor film 12 by irradiation with the rare gas G1. Next, the modified layer 12X is sputtered by irradiation with the rare gas G2. This removes the modified layer 12X and etches the oxide semiconductor film 12.

The rare gas G1 and the rare gas G2 are each selected from helium (He), neon (Ne), argon (Ar), krypton (Kr), and xenon (Xe). It is preferable in the present embodiment that a rare gas having less molecular weight than that of the rare gas G2 to sputter the modified layer 12X be used as the rare gas G1 to form the modified layer 12X. The use of a rare gas having less molecular weight makes it possible to deeply enter the oxide semiconductor film 12 in the film thickness direction. This makes it possible to form the modified layer 12X deep inside the oxide semiconductor film 12. In addition, it is preferable that a rare gas having greater molecular weight than that of the rare gas G1 be used as the rare gas G2 to sputter the modified layer 12X. A rare gas having greater molecular weight has higher sputtering rate. This makes it possible to increase the etching speed. As can be seen from the above, it is preferable to select the rare gas G1 from helium (He) or neon (Ne). It is preferable to select the rare gas G2 from neon (Ne), argon (Ar), and xenon (Xe).

(1-2. Workings and Effects)

As described above, in a case where an oxide semiconductor film such as ITO or IGZO is etched by using hydrogen plasma, there is an issue that the composition of the oxide semiconductor film changes over time and the characteristics of a device including the oxide semiconductor film are deteriorated.

FIG. 2 illustrates a result obtained by measuring, by using X-ray photoelectron spectroscopy (XPS), the ratios of In in an ITO film before and after etching in which $H_2/Ar$ plasma is used under a measurement condition of In $3d_{5/2}$. It is assumed that In has a Binding energy (eV) of 444.11 eV, $In_2O_3$ has a Binding energy (eV) of 444.32 eV, and the In ratio is calculated as a ratio of $In/In_2O_3$. It can be seen that In-In bonding is increased in the ITO film after $H_2/Ar$ plasma irradiation as compared with the ITO film before the $H_2/Ar$ plasma irradiation.

FIG. 3A schematically illustrates a TEM image of an ITO film 1012 after $H_2$ plasma irradiation. The ITO film 1012 is formed on a substrate 1011. In a case where an oxide semiconductor film such as ITO is irradiated with $H_2$ plasma, a bump-shaped modified layer is formed on a surface of the oxide semiconductor film as illustrated in FIG. 3A. FIG. 3B illustrates a result obtained by measuring the concentrations of In and O in a modified layer portion (A) and an ITO film portion (B) other than a modified layer illustrated in FIG. 3A by using energy dispersive X-ray spectroscopy (EXD). It can be seen that the modified layer portion (A) has a higher In concentration than that of the ITO film portion (B) other than the modified layer and the modified layer is formed by aggregating In.

In a case where the oxide semiconductor film is etched by using hydrogen plasma in this way, the entry of H atoms desorbs O atoms from ITO in the ITO film, causing a surface to become In-rich. In the oxide semiconductor film having an In-rich surface, for example, an insulation property is reduced. The oxide semiconductor is used as an electrode material of the device as described above. However, for example, in a case where an upper electrode and a lower electrode disposed to be opposed to each other with a display layer interposed in between each include the oxide semiconductor film and the oxide semiconductor film is etched by using hydrogen plasma as described above, a change in the composition of the oxide semiconductor film as described above causes a short circuit between the upper electrode and the lower electrode.

In contrast, in the present embodiment, the oxide semiconductor film 12 is etched by using the two types of rare gases of the rare gas G1 and the rare gas G2. Specifically, the modified layer 12X is formed in the oxide semiconductor film 12 by irradiation with the rare gas G1 having less molecular weight and the modified layer 12X is then sputtered by irradiation with the rare gas G2 having greater molecular weight than that of the rare gas G1.

Each of FIGS. 4A to 4C schematically illustrates a change in the crystal structure on the surface of the oxide semiconductor film 12 caused by the amount of radiated ions $G^+$ observed by TEM. The oxide semiconductor film 12 has a plurality of crystal grains 121 and a plurality of grain boundaries 122 inside. In a case of a small amount of radiated ions $G^+$ (e.g., less than an Ion dose of $1 \times 10^{17}$ ions/cm$^2$) as illustrated in FIG. 4A, no change is observed in the crystal structure on the surface of the oxide semiconductor film. An increase in the amount of radiated ions $G^+$ (e.g., greater than or equal to an Ion dose of $1 \times 10^{17}$ ions/cm$^2$) forms new crystal grains 121 and grain boundaries 122 on the surface of the oxide semiconductor film. In other words, as illustrated in FIGS. 4B and 4C, the crystal grains 121 and the grain boundaries 122 are increased on the surface of the oxide semiconductor film in proportion to an increasing amount of radiated ions $G^+$. In other words, the modified layer 12X formed in the present embodiment results from disturbed crystallizability by an increase in the grain boundaries 122 and grain boundaries 122 caused by ions $G^+$ entering the oxide semiconductor film 12. This is different from a chemical modification such as desorbing oxygen by etching with use of hydrogen ions ($H^+$) as described above. Oxygen is less easily desorbed. The oxide semiconductor film has a constant composition over the film thickness direction.

As described above, in the etching method for the oxide semiconductor film 12 according to the present embodiment according to the present embodiment, the modified layer 12X is formed in the oxide semiconductor film 12 and the modified layer 12X is sputtered by using the two types of rare gases of the rare gas G1 and the rare gas G2. This makes it possible to suppress a temporal change in the composition ratio of the oxide semiconductor film 12 after the sputtering.

In addition, in the present embodiment, for example, a rare gas such as He or Ne having less molecular weight is used as the rare gas G1 to form the modified layer 12X. This makes it possible to form, deep inside the oxide semiconductor film 12, the modified layer 12X formed on the surface.

Further, in the present embodiment, for example, a rare gas such as Ne, Ar, and Xe each having greater molecular weight is used as the rare gas G2 to sputter the modified layer 12X. This makes it possible to increase the etching speed of the modified layer 12X.

It is to be noted that an example of a two-step etching method in which the modified layer 12X is formed by irradiation with the rare gas G1 and the modified layer 12X is then sputtered by replacing the rare gas G1 with the rare gas G2 for irradiation has been described in the present embodiment as the etching method for the oxide semiconductor film 12, but the etching method is not limited to this. For example, the modified layer 12X may be alternately formed and sputtered by alternately irradiating the modified layer 12X with the rare gas G1 and the rare gas G2. This makes it possible to increase the processing accuracy.

The following describes second and third embodiments of the present disclosure. It is to be noted that the same components as those of the first embodiment described above are denoted by the same signs and descriptions thereof are omitted.

2. Second Embodiment

Each of FIGS. 5A and 5B is a cross-sectional schematic diagram illustrating an etching step for an oxide semiconductor film (oxide semiconductor film 12) according to the second embodiment of the present disclosure. In an etching method for the oxide semiconductor film 12 according to the present embodiment, a mixture of the two types of rare gases of the rare gas G1 and the rare gas G2 is used to form and sputter the modified layer 12X of the oxide semiconductor film 12 in one step. The following describes the etching method for the oxide semiconductor film 12 with reference to FIGS. 5A and 5B.

First, as illustrated in FIG. 5A, the oxide semiconductor film 12 is formed on a supporting base material 11 by using, for example, a dry method or a wet method as in the first embodiment described above. Subsequently, as illustrated in FIG. 5B, a mixture gas is radiated that is obtained, for example, by mixing the rare gas G1 and the rare gas G2, for example, at a volume ratio within a range within which the ratio of the rare gas G1 to the rare gas G2 is 10:90 or more and 95:5 or less. This forms the modified layer 12X in the oxide semiconductor film 12 and removes the modified layer 12X by sputtering in one step.

As in the first embodiment, it is preferable to select the rare gas G1 of the rare gas G1 and the rare gas G2 from helium (He) and neon (Ne) each having less molecular weight. It is preferable to select the rare gas G2 from neon (Ne), argon (Ar), and xenon (Xe). A combination of the rare gas G1 and the rare gas G2 is not particularly limited. Examples of the combination include combinations such as He/Ne, He/Ar, and He/Xe. In addition, a combination of two or more types of rare gases as the rare gas G1 described above and two or more types of rare gases as the rare gas G2 described above may be used as the mixture gas used in the etching step for the oxide semiconductor film 12 described above.

As described above, in the etching method for the oxide semiconductor film 12 according to the present embodiment, the oxide semiconductor film 12 is irradiated with a mixture of the two types of rare gases of the rare gas G1 and the rare gas G2. This makes it possible to form and sputter the modified layer 12X in one step. Accordingly, an effect of making it possible to simplify the etching step is attained in addition to the effects in the first embodiment described above.

3. Third Embodiment

Each of FIGS. 6A to 6C is a cross-sectional schematic diagram illustrating an etching step for an oxide semiconductor film (oxide semiconductor film 12) according to the third embodiment of the present disclosure. The etching method for the oxide semiconductor film 12 according to the present disclosure is used, for example, for any of various devices, an electromagnetic shield, an anti-reflection film, and the like as described above. For example, in relation to displays, the etching method is favorably used to process electrodes, thin film transistors (TFTs), and color filters included in a TN (Twist Nematic) liquid crystal display and an STN (Super Twist Nematic) liquid crystal display, an OLED (Organic Light Emitting Diode), a PDP (Plasma Display Panel), an FED (Field Emission Display), and an electronic paper. The following describes an example of the specific etching method for the oxide semiconductor film 12 with reference to FIGS. 6A to 6C.

First, as illustrated in FIG. 6A, a resist film 21 patterned into a predetermined shape is formed on the oxide semiconductor film 12 formed on the support base 11. Subsequently, as illustrated in FIG. 6B, irradiation with the rare gas G1 is performed. This causes the rare gas G1 to enter the oxide semiconductor film 12 exposed from an opening 21H formed in the resist film 21 to form the modified layer 12X. Next, as illustrated in FIG. 6C, the modified layer 12X is sputtered by irradiation with the rare gas G2. This etches the modified layer 12X to form an opening 12H in the oxide semiconductor film 12.

It is to be noted that the modified layer 12X is a region in which the entry of rare gas plasma increases crystal grains and grain boundaries as described above. The modified layer 12X is a region in which the crystallizability of the oxide semiconductor film 12 is disturbed. This modified layer 12X exists in the side surface having a pattern formed by etching and even in the bottom surface of an opening formed by etching in a case where etching is stopped in the middle.

As described above, the resist film 21 patterned into a desired shape is formed on the oxide semiconductor film 12. After that, the modified layer 12X is formed in the oxide semiconductor film 12 and the modified layer 12X is sputtered by using the two types of rare gases of the rare gas G1 and the rare gas G2. This makes etching possible without changing the composition of the oxide semiconductor film 12. It is possible to suppress a temporal change in the composition ratio of the oxide semiconductor film 12. It is therefore possible to prevent the characteristics of a device including the oxide semiconductor film 12 from being deteriorated.

4. Application Examples

The oxide semiconductor film 12 processed by using the etching method described in the first embodiment (or the second embodiment) described above is applicable, for example, to an electronic device described below.
(Application Example 1)
FIG. 7 illustrates an overall configuration of an imaging element (imaging element 1) including the oxide semiconductor film 12 processed by using the etching method described in the first embodiment (or the second embodiment) described above. This imaging element 1 is a CMOS image sensor. The imaging element 1 includes a pixel section 1a as an imaging area on a semiconductor substrate 30. The imaging element 1 includes a peripheral circuit portion 130 in a peripheral region of this pixel section 1a. The peripheral circuit portion 130 includes, for example, a row scanning section 131, a horizontal selection section 133, a column scanning section 134, and a system control section 132. Each of the etching methods for the oxide semiconductor film according to the first embodiment and the like described above is favorably used, for example, to process a pair of electrodes (a lower electrode 41 and an upper electrode 45) and an electric charge accumulation layer 43 included in an organic photoelectric conversion section 40 (see FIG. 8 for both of them). The following describes the imaging element 1.

The pixel section 1a includes, for example, a plurality of unit pixels P (each corresponding to a photoelectric converter 10) two-dimensionally disposed in a matrix. These unit pixels P are provided, for example, with pixel drive lines Lread (specifically, a row selection line and a reset control line) in each of pixel rows and provided with vertical signal lines Lsig in each of pixel columns. The pixel drive lines Lread are each for transmitting drive signals for reading out signals from pixels. One end of each of the pixel drive lines Lread is coupled to the output end of the row scanning section 131 corresponding to each row.

The row scanning section 131 is a pixel drive section that includes a shift register, an address decoder, and the like and drives the respective unit pixels P of the pixel section 1a, for example, row by row. Signals outputted from the respective unit pixels P in the pixel rows selectively scanned by the row scanning section 131 are supplied to the horizontal selection section 133 through the respective vertical signal lines Lsig. The horizontal selection section 133 includes an amplifier, a horizontal selection switch, and the like provided for each of the vertical signal lines Lsig.

The column scanning section 134 includes a shift register, an address decoder, and the like. The column scanning section 134 drives the horizontal selection switches of the horizontal selection section 133 in order while scanning each of the horizontal selection switches. The selective scanning by this column scanning section 134 causes the signals of the respective pixels transmitted through the respective vertical signal lines Lsig to be outputted in order to a horizontal signal line 135 and transmitted to the outside of the semiconductor substrate 30 through the horizontal signal line 135.

The circuit portion including the row scanning section 131, the horizontal selection section 133, the column scanning section 134, and the horizontal signal line 135 may be formed directly on the semiconductor substrate 30 or disposed in external control IC. In addition, those circuit portions may be formed on another substrate coupled by a cable or the like.

The system control section 132 receives a clock given from the outside of the semiconductor substrate 30 or data or the like for issuing an instruction about an operation mode. In addition, the system control section 132 outputs data such as internal information regarding the imaging element 1. The system control section 132 further includes a timing generator that generates a variety of timing signals. The system control section 132 controls the driving of the peripheral circuits such as the row scanning section 131, the horizontal selection section 133, and the column scanning section 134 on the basis of the variety of timing signals generated by the timing generator.

FIG. 8 schematically illustrates an example of a cross-sectional configuration of the photoelectric converter 10 used as one pixel (unit pixel P) in the imaging element 1. The photoelectric converter 10 is a photoelectric converter of a so-called longitudinal spectral type in which, for example, the one organic photoelectric conversion section 40 and two inorganic photoelectric conversion sections 32B and 32R are stacked in the longitudinal direction. The organic photoelectric conversion section 40 is provided on a first surface (back surface) 30S1 side of the semiconductor substrate 30. The inorganic photoelectric conversion sections 32B and 32R are formed to be embedded in the semiconductor substrate 30 and stacked in the thickness direction of the semiconductor substrate 30. The organic photoelectric conversion section 40 includes a photoelectric conversion layer 44 between the lower electrode 41 and the upper electrode 45 disposed to be opposed to each other. The photoelectric conversion layer 44 is formed by using an organic material. This photoelectric conversion layer 44 includes a p-type semiconductor and an n-type semiconductor. The photoelectric conversion layer 44 has a bulk heterojunction structure in a layer. The bulk heterojunction structure is a p/n junction surface formed by mixing a p-type semiconductor and an n-type semiconductor.

In the organic photoelectric conversion section 40 of this photoelectric converter 10, the lower electrode 41 includes, for example, a plurality of electrodes (a readout electrode 41A and an accumulation electrode 41B) for each pixel. The organic photoelectric conversion section 40 includes an insulating layer 42 and the electric charge accumulation layer 43 in order between these lower electrode 41 and photoelectric conversion layer 44. The insulating layer 42 is provided with an opening 42H above the readout electrode 41A and the readout electrode 41A is electrically coupled to the electric charge accumulation layer 43 via this opening 42H.

The organic photoelectric conversion section 40 and the inorganic photoelectric conversion sections 32B and 32R selectively detect pieces of light in the respective different wavelength ranges to perform photoelectric conversion. For example, the organic photoelectric conversion section 40 acquires a color signal of green (G). The inorganic photoelectric conversion sections 32B and 32R respectively acquire a color signal of blue (B) and a color signal of red (R) by using different absorption coefficients. This allows the photoelectric converter 10 to acquire a plurality of types of color signals in one pixel without using a color filter.

For example, floating diffusions (floating diffusion layers) FD1, FD2, and FD3, a transfer transistor Tr2 (a longitudinal type) transistor and a transfer transistor Tr3, an amplifier transistor (modulator) AMP, a reset transistor RST, a selection transistor SEL, and a multilayer wiring layer 50 are provided on a second surface (front surface) 30S2 of the semiconductor substrate 30. The multilayer wiring layer 50 has a configuration in which wiring layers 51, 52, and 53 are stacked in an insulating layer 54.

It is to be noted that the first surface 30S1 side of the semiconductor substrate 30 is represented as a light incidence side S1 and the second surface 30S2 side is represented as a wiring layer side S2 in the diagram.

The organic photoelectric conversion section 40 has a configuration in which the lower electrode 41, the electric charge accumulation layer 43, the photoelectric conversion layer 44, and the upper electrode 45 are stacked in this order from the first surface 30S1 side of the semiconductor substrate 30 as described above. In addition, the insulating layer 42 is provided between the lower electrode 41 and the electric charge accumulation layer 43. Of the lower electrode 41, the readout electrode 41A is electrically coupled to the photoelectric conversion layer 44 via the opening 42H provided in the insulating layer 42 as described above. For example, there are provided a fixed electric charge 33, a dielectric layer 34, and an interlayer insulating layer 37 between the first surface 30S1 of the semiconductor substrate 30 and the lower electrode 41. There is provided a protective layer 46 on the upper electrode 45. For example, there is provided a light-shielding film 47 above the readout electrode 41A in the protective layer 46. There are provided optical members such as a planarization layer (not illustrated) and an on-chip lens 48 above the protective layer 46.

There is provided a through electrode 36 between the first surface 30S1 and the second surface 30S2 of the semiconductor substrate 30. The organic photoelectric conversion section 40 is coupled, via this through electrode 36, to a gate Gamp of the amplifier transistor AMP and one source/drain region 36B of the reset transistor RST (reset transistor Tr1rst) also serving as the floating diffusion FD1. This allows the photoelectric converter 10 to favorably transfer an electric charge generated in the organic photoelectric conversion section 40 on the first surface 30S1 side of the semiconductor substrate 30 to the second surface 30S2 side of the semiconductor substrate 30 via the through electrode 36, thereby increasing the characteristics.

The imaging element 1 described above is applicable, for example, to a variety of electronic apparatuses including an imaging apparatus such as a digital still camera and a digital video camera, a mobile phone having an imaging function, another apparatus having an imaging function, or the like.

FIG. 9 is a block diagram illustrating a configuration example of an imaging apparatus (imaging apparatus 201) serving as an electronic apparatus to which the present technology is applied.

The imaging apparatus 201 illustrated in FIG. 9 includes an optical system 202, a shutter device 203, a solid-state imaging device 204, a control circuit 20, a signal processing circuit 206, a monitor 207, and a memory 208. The imaging apparatus 201 is able to capture a still image or a moving image.

The optical system 202 includes one lens or a plurality of lenses. The optical system 202 guides light (incident light) from a subject to the solid-state imaging device 204 and forms an image on the light reception surface of the solid-state imaging device 204.

The shutter device 203 is disposed between the optical system 202 and the solid-state imaging device 204. The shutter device 203 controls, in accordance with control by the control circuit 205, a period in which the solid-state imaging device 204 is irradiated with the light and a period in which the light is blocked.

The solid-state imaging device 204 includes a package that includes the imaging element 1 described above. The solid-state imaging device 204 accumulates signal charges for a certain period in accordance with light of which an image is formed on the light reception surface via the optical system 202 and the shutter device 203. The signal charges accumulated in the solid-state imaging device 204 are transferred in accordance with a drive signal (timing signal) supplied from the control circuit 205.

The control circuit 205 outputs drive signals for controlling a transfer operation of the solid-state imaging device 204 and a shutter operation of the shutter device 203 to drive the solid-state imaging device 204 and the shutter device 203.

The signal processing circuit 206 performs various kinds of signal processing on the signal charges outputted from the solid-state imaging device 204. An image (image data) obtained by performing signal processing by the signal processing circuit 206 is supplied to the monitor 207 and displayed on the monitor 207 or is supplied to the memory 208 and stored (recorded) in the memory 208.

(Application Example 2)

FIG. 10 illustrates a schematic configuration of a reflective display apparatus 2. The reflective display apparatus 2 is an electrophoretic display that generates contrast by using an electrophoretic phenomenon and an electrophoretic element (electrophoretic element 80) is used for a display layer provided between a drive substrate 60 and a counter substrate 70. The etching method for the oxide semiconductor film according to the first embodiment or the like described above is favorably used, for example, to process a counter electrode 72 included in the counter substrate 70. It is to be noted that FIG. 10 schematically illustrates a configuration of the reflective display apparatus 2. The dimensions and shape of the reflective display apparatus 2 are different from the actual dimensions and shape.

For example, as illustrated in FIG. 10, the reflective display apparatus 2 includes the drive substrate 60 and the counter substrate 70 that are disposed to be opposed to each other with the electrophoretic element 80 interposed in between. The reflective display apparatus 2 has a display surface on the counter substrate 70 side. This wording "has a display surface on the counter substrate 70 side" means that an image is displayed toward the counter substrate 70 side (a user is able to visually recognize the image from the counter substrate 70 side).

The drive substrate 60 includes, for example, a thin film transistor (Thin Film Transistor; TFT) 62, a protective layer 63, a planarization insulating layer 64, and a pixel electrode 65 that are formed in this order on one surface of a supporting base 61. The TFTs 62 and the pixel electrodes 65 are dividedly disposed and dividedly formed in a matrix or in a segment in accordance with a pixel pattern or the like, for example.

The counter substrate 70 includes, for example, a supporting base 71 and the counter electrode 72 and this counter electrode 72 is provided on the surface of the supporting base 71 opposed to the drive substrate 60. The counter electrodes 72 may be disposed in a matrix or a segment as with the pixel electrodes 65.

The electrophoretic element 80 includes electrophoretic particles 82 and a porous layer 83 in an insulating liquid 81 as illustrated in FIG. 10. The electrophoretic particles 82 are dispersed in the insulating liquid 81. The porous layer 83 includes, for example, a fibrous structure and non-electrophoretic particles and has a plurality of fine holes 833. There is provided a partition wall 85 between the drive substrate 60 and the counter substrate 70. The partition wall 85 holds, for example, a space between the drive substrate 60 and the counter substrate 70 and partitions, for example, the space between the drive substrate 60 and the counter substrate 70 for each pixel.

It is to be noted that the configuration of the reflective display apparatus 2 illustrated in FIG. 10 is an example. It is possible to make a variety of modifications. For example, there may be provided an optical member such as a wavelength conversion layer, for example, on the display surface side of the counter substrate 70. The wavelength conversion layer converts the wavelength of an invisible region into the wavelength of a visible region.

It is to be noted that the imaging element 1 illustrated in FIG. 7 as the application example 1 described above is applicable, for example, to the following products.

5. Practical Application Examples

<Practical Application Example to Endoscopic Surgery System>

The technology (the present technology) according to the present disclosure is applicable to a variety of products. For example, the technology according to the present disclosure may be applied to an endoscopic surgery system.

FIG. 11 is a view depicting an example of a schematic configuration of an endoscopic surgery system to which the technology according to an embodiment of the present disclosure (present technology) can be applied.

In FIG. 11, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 12 is a block diagram depicting an example of a functional configuration of the camera head 11102 and the CCU 11201 depicted in FIG. 11.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has described the example of the endoscopic surgery system to which the technology according to the present disclosure may be applied. The technology according to the present disclosure may be applied to the image pickup unit 11402 among the components described above. The application of the technology according to the present disclosure to the image pickup unit 11402 increases the detection accuracy.

It is to be noted that the endoscopic surgery system has been described here as an example, but the technology according to the present disclosure may be additionally applied, for example, to a microscopic surgery system or the like.

<Practical Application Example to Mobile Body>

The technology according to the present disclosure is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

FIG. 13 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 13, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 13, an audio speaker 12061, a display section 12062, and an instrument panel 12063 are illustrated as the output device. The display section 12062 may, for example, include at least one of an on-board display and a head-up display.

FIG. 14 is a diagram depicting an example of the installation position of the imaging section 12031.

In FIG. 14, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 14 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Descriptions have been given above with reference to the first to third embodiments and the application examples and the practical application examples, but the contents of the present disclosure are not limited to these embodiments and the like. It is possible to make a variety of modifications.

It is to be noted that the etching method for the oxide semiconductor film according to the present disclosure may be configured as below. According to the following configurations, the modified layer is formed in the oxide semiconductor film and the modified layer is sputtered by using rare gases (the first rare gas and the second rare gas) different from each other. This reduces oxygen that is desorbed from the oxide semiconductor film after the sputtering. In other words, it is possible to suppress a temporal change in the composition ratio of the oxide semiconductor film. It is to be noted that the effects described here are not necessarily limited, but any of effects described in the present disclosure may be included.

(1)

An etching method for an oxide semiconductor film, the etching method including:

forming a modified layer in the oxide semiconductor film by using a first rare gas; and sputtering the modified layer by using a second rare gas different from the first rare gas.

(2)

The etching method for the oxide semiconductor film according to (1), in which a rare gas is used as the first rare gas, the rare gas having less molecular weight than molecular weight of the second rare gas.

(3)

The etching method for the oxide semiconductor film according to (1) or (2), in which the oxide semiconductor film is irradiated with the first rare gas and then irradiated with the second rare gas.

(4)

The etching method for the oxide semiconductor film according to (1) or (2), in which the oxide semiconductor film is irradiated with a mixture of the first rare gas and the second rare gas.

(5)

The etching method for the oxide semiconductor film according to any of (1) to (3), in which the oxide semiconductor film is alternately irradiated with the first rare gas and the second rare gas.

(6)

The etching method for the oxide semiconductor film according to any of (1) to (5), in which at least one of helium (He) or neon (Ne) is used as the first rare gas.

(7)

The etching method for the oxide semiconductor film according to any of (1) to (6), in which at least one of neon (Ne), argon (Ar), or xenon (Xe) is used as the second rare gas.

(8)

The etching method for the oxide semiconductor film according to any of (1) to (7), in which the oxide semiconductor film includes any of indium oxide, indium tin oxide (ITO), indium zinc oxide (IZO), indium gallium oxide (IGO), indium gallium zinc oxide (IGZO or In—GaZnO$_4$), indium tin zinc oxide (ITZO), IFO (F-doped In$_2$O$_3$), tin oxide (SnO$_2$), ATO (Sb-doped SnO$_2$), FTO (F-doped SnO$_2$), zinc oxide (ZnO), aluminum zinc oxide (AZO), gallium zinc oxide (GZO), titanium oxide (TiO$_2$), niobium titanium oxide (TNO), antimony oxide, spinel-type oxide, oxide having a YbFe$_2$O$_4$ structure, gallium oxide, titanium oxide, niobium oxide, and nickel oxide.

This application claims the priority on the basis of Japanese Patent Application No. 2019-003234 filed with Japan Patent Office on Jan. 11, 2019, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An etching method for an oxide semiconductor film, the etching method comprising:

forming a modified layer in the oxide semiconductor film by using a first rare gas; and sputtering the modified layer by using a second rare gas different from the first rare gas, wherein the first rare gas having a molecular weight less than the second rare gas, wherein the oxide semiconductor film is irradiated with the first rare gas and then irradiated with the second rare gas, and wherein the first rare gas is neon (Ne) and helium (He), and wherein the second rare gas is two or more of (Ne), argon (Ar), or xenon (Xe).

2. The etching method for the oxide semiconductor film according to claim 1, wherein the oxide semiconductor film is alternately irradiated with the first rare gas and the second rare gas.

3. The etching method for the oxide semiconductor film according to claim 1, wherein the oxide semiconductor film includes any of indium oxide, indium tin oxide (ITO), indium zinc oxide (IZO), indium gallium oxide (IGO), indium gallium zinc oxide (IGZO or In-GaZnO$_4$), indium tin zinc oxide (ITZO), IFO (F-doped In$_2$O$_3$), tin oxide (SnO$_2$), ATO (Sb-doped SnO$_2$), FTO (F-doped SnO$_2$), zinc oxide (ZnO), aluminum zinc oxide (AZO), gallium zinc oxide (GZO), titanium oxide (TiO$_2$), niobium titanium oxide (TNO), antimony oxide, spinel-type oxide, oxide having a YbFe$_2$O$_4$ structure, gallium oxide, titanium oxide, niobium oxide, and nickel oxide.

4. An etching method for an oxide semiconductor film, the etching method comprising:

forming a modified layer in the oxide semiconductor film by using a first rare gas; and sputtering the modified layer by using a second rare gas different from the first rare gas, wherein the first rare gas having a molecular weight less than the second rare gas, wherein the oxide semiconductor film is irradiated with the first rare gas and then irradiated with the second rare gas, and, wherein the first rare gas is neon (Ne), and wherein the second rare gas is at least one of argon (Ar), or xenon (Xe).

5. The etching method for the oxide semiconductor film according to claim 4, wherein the oxide semiconductor film is alternately irradiated with the first rare gas and the second rare gas.

6. The etching method for the oxide semiconductor film according to claim 4, wherein the oxide semiconductor film includes any of indium oxide, indium tin oxide (ITO), indium zinc oxide (IZO), indium gallium oxide (IGO), indium gallium zinc oxide (IGZO or In-GaZnO$_4$), indium tin zinc oxide (ITZO), IFO (F-doped In$_2$O$_3$), tin oxide (SnO$_2$), ATO (Sb-doped SnO$_2$), FTO (F-doped SnO$_2$), zinc oxide (ZnO), aluminum zinc oxide (AZO), gallium zinc oxide (GZO), titanium oxide (TiO$_2$), niobium titanium oxide (TNO), antimony oxide, spinel-type oxide, oxide having a YbFe$_2$O$_4$ structure, gallium oxide, titanium oxide, niobium oxide, and nickel oxide.

\* \* \* \* \*